United States Patent
Frachon

(10) Patent No.: US 12,228,468 B2
(45) Date of Patent: Feb. 18, 2025

(54) POSITION SENSOR, DESIGNED IN PARTICULAR FOR DETECTING TORSION IN A STEERING COLUMN

(71) Applicant: Moving Magnet Technologies, Besançon (FR)

(72) Inventor: Didier Frachon, Besançon (FR)

(73) Assignee: MOVING MAGNET TECHNOLOGIES, Besançon (FR)

( * ) Notice: Subject to any disclaimer, the term of this patent is extended or adjusted under 35 U.S.C. 154(b) by 448 days.

(21) Appl. No.: 17/433,188

(22) PCT Filed: Feb. 25, 2020

(86) PCT No.: PCT/FR2020/050353
§ 371 (c)(1),
(2) Date: Aug. 23, 2021

(87) PCT Pub. No.: WO2020/174171
PCT Pub. Date: Sep. 3, 2020

(65) Prior Publication Data
US 2022/0136918 A1    May 5, 2022

(30) Foreign Application Priority Data
Feb. 25, 2019    (FR) ...................................... 1901907

(51) Int. Cl.
*G01L 5/22*      (2006.01)
*B62D 15/02*    (2006.01)
(Continued)

(52) U.S. Cl.
CPC ............... *G01L 5/221* (2013.01); *B62D 15/02* (2013.01); *G01B 7/30* (2013.01); *G01D 5/145* (2013.01);
(Continued)

(58) Field of Classification Search
CPC ......... G01L 5/221; G01L 3/104; B62D 15/02; G01B 7/30; G01D 5/145; G01D 5/142; G01R 33/06
(Continued)

(56) References Cited

U.S. PATENT DOCUMENTS 8,418,570 B2    4/2013    Maehara
2004/0011138 A1*    1/2004    Gandel ................... G01L 3/104
73/847

(Continued)

FOREIGN PATENT DOCUMENTS

CN    102203560 A    9/2011
CN    103134628 A    6/2013
(Continued)

OTHER PUBLICATIONS

International Search Report for International Application No. PCT/FR2020/050353 dated Jun. 23, 2020, 2 pages.
(Continued)

*Primary Examiner* — Peter J Macchiarolo
*Assistant Examiner* — Monica S Young
(74) *Attorney, Agent, or Firm* — TraskBritt

(57) ABSTRACT

A position sensor, designed, in particular, for detecting torsion in a steering column, includes a first magnetized magnetic rotor structure comprising a plurality of magnets, two flux-collecting components, which define at least one air gap in which at least one magnetically sensitive element is positioned. Each collecting component has at least one primary collecting zone extended by at least one extension having at least one secondary collecting zone. The secondary collecting zones end in flattened shoes that form the two poles of the air gap. The transverse mid-plane of the air gap intersects at least one of the extensions.

8 Claims, 15 Drawing Sheets

(51) Int. Cl.
*G01B 7/30* (2006.01)
*G01D 5/14* (2006.01)
*G01L 3/10* (2006.01)
*G01R 33/06* (2006.01)

(52) U.S. Cl.
CPC .............. *G01L 3/104* (2013.01); *G01D 5/142* (2013.01); *G01R 33/06* (2013.01)

(58) Field of Classification Search
USPC .................................................. 73/862.325
See application file for complete search history.

(56) References Cited

U.S. PATENT DOCUMENTS

| | | | | |
|---|---|---|---|---|
| 2008/0250873 | A1* | 10/2008 | Prudham | G01L 3/104 73/862.334 |
| 2009/0027045 | A1 | 1/2009 | Islam et al. | |
| 2009/0078058 | A1 | 3/2009 | Aoki et al. | |
| 2010/0194385 | A1* | 8/2010 | Ronnat | B62D 15/0245 324/207.25 |
| 2012/0146627 | A1* | 6/2012 | Masson | G01B 7/30 324/207.21 |
| 2013/0152702 | A1* | 6/2013 | Takahashi | G01L 3/104 73/862.331 |
| 2014/0130612 | A1 | 5/2014 | Takahashi et al. | |
| 2014/0283623 | A1* | 9/2014 | Song | B62D 6/10 73/862.193 |
| 2016/0138983 | A1 | 5/2016 | Ikeda | |
| 2016/0214648 | A1* | 7/2016 | Schoepe | G01L 3/104 |
| 2017/0254710 | A1* | 9/2017 | Lee | B62D 15/02 |
| 2017/0276557 | A1* | 9/2017 | Jun | B62D 15/02 |
| 2018/0180497 | A1* | 6/2018 | Nishiguchi | G01L 3/104 |

FOREIGN PATENT DOCUMENTS

| | | | | |
|---|---|---|---|---|
| CN | 103424218 | A | 12/2013 | |
| CN | 103808443 | A | 5/2014 | |
| CN | 104039632 | A | 9/2014 | |
| CN | 106794868 | A | 5/2017 | |
| CN | 106794872 | A | 5/2017 | |
| DE | 102012014208 | A1 * | 5/2014 | ............ G01L 3/104 |
| JP | 2009-020064 | A | 1/2009 | |
| JP | 2016-090492 | A | 5/2016 | |
| JP | 2016-095281 | A | 5/2016 | |
| JP | 6036220 | B2 | 11/2016 | |
| KR | 1997-0006701 | A | 2/1997 | |
| KR | 10-1998-0007896 | | 3/1998 | |
| KR | 10-2012-0010696 | A | 2/2012 | |
| KR | 10-2016-0029991 | | 3/2016 | |
| WO | WO-2007077406 | A2 * | 7/2007 | ............ G01L 3/104 |
| WO | 2012/084288 | A1 | 6/2012 | |
| WO | 2016/032785 | A1 | 3/2016 | |

OTHER PUBLICATIONS

International Written Opinion for International Application No. PCT/FR2020/050353 dated Jun. 23, 2020, 7 pages.
Chinese 2nd Office Action for CN Application No. 202080016188.2, mailed Aug. 29, 2023, 12 pages with English translation.
Chinese First Office Action for Chinese Application No. 202080016188.2, dated Feb. 13, 2023, 8 pages with translation.

* cited by examiner

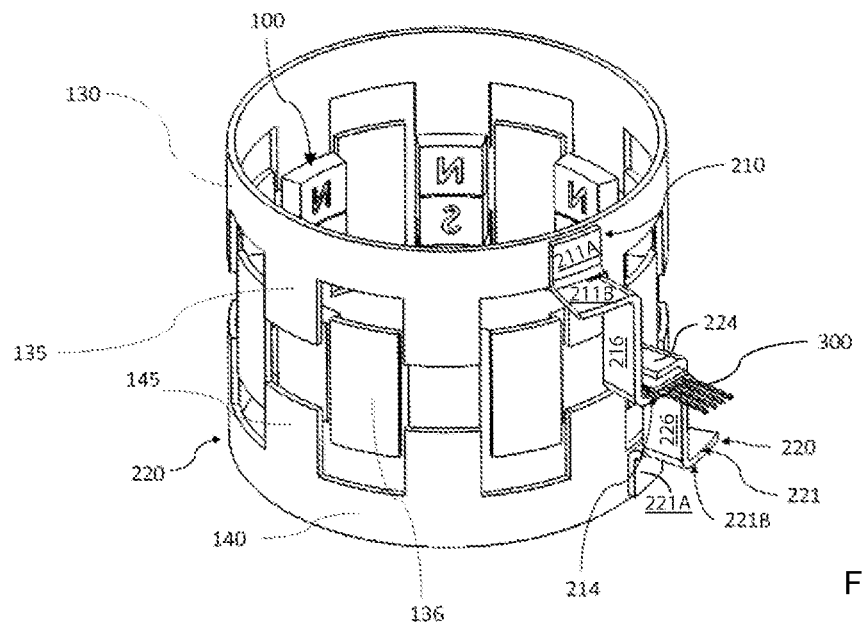
FIG. 4
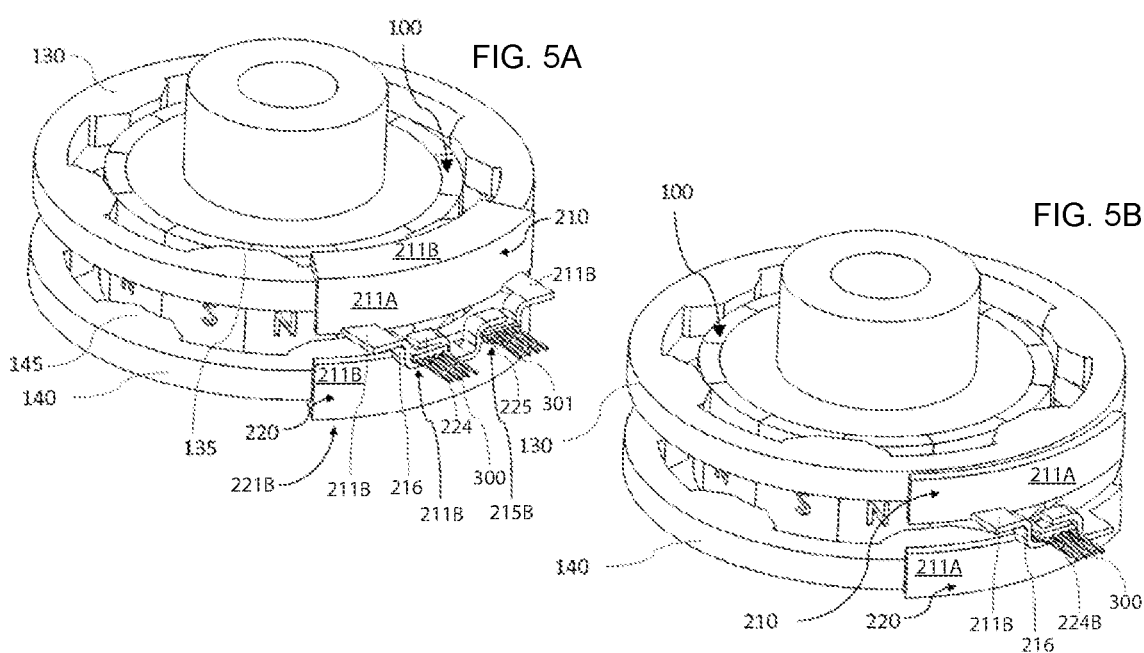
FIG. 5A
FIG. 5B

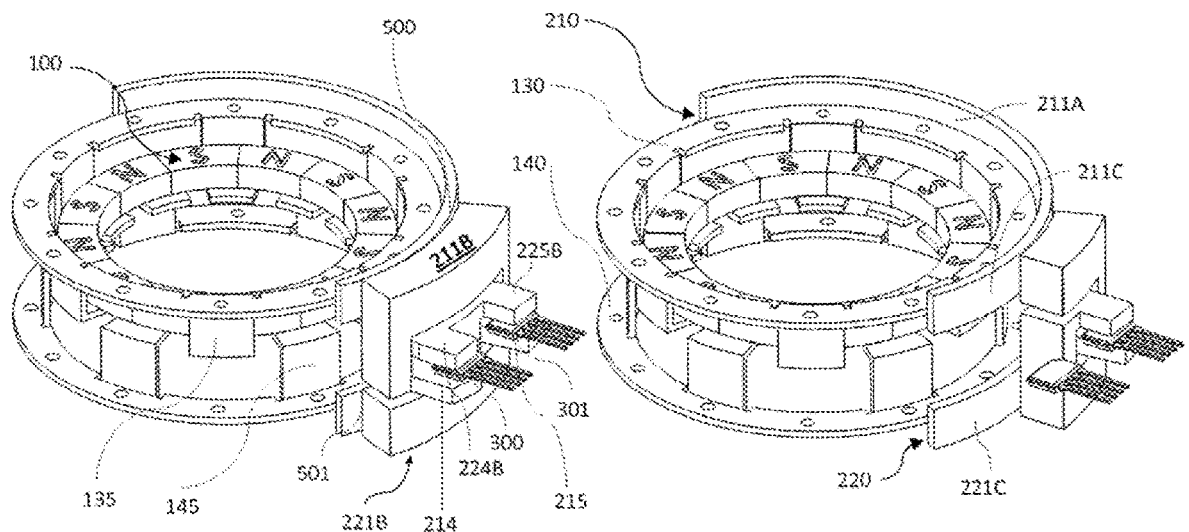
FIG. 18A
FIG. 18B
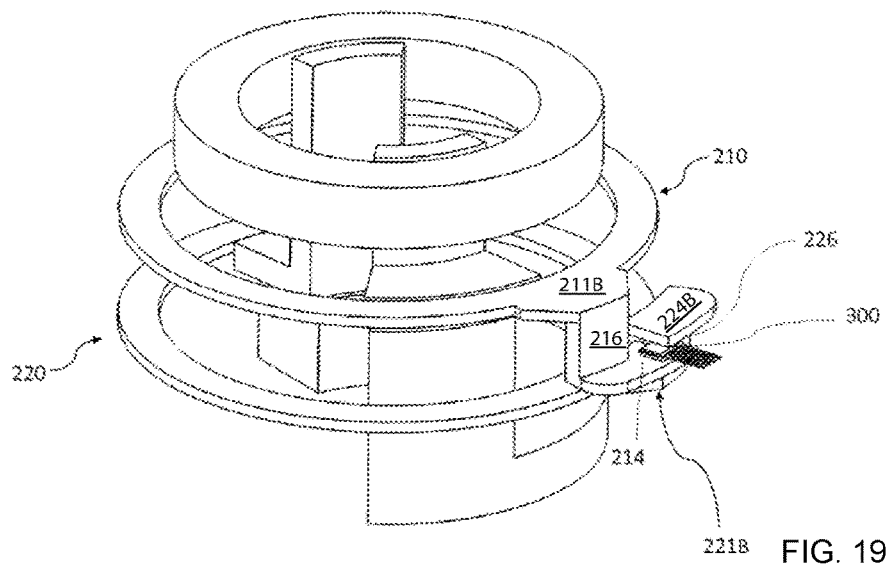
FIG. 19

POSITION SENSOR, DESIGNED IN PARTICULAR FOR DETECTING TORSION IN A STEERING COLUMN

CROSS-REFERENCE TO RELATED APPLICATIONS

This application is a national phase entry under 35 U.S.C. § 371 of International Patent Application PCT/FR2020/050353, filed Feb. 25, 2020, designating the United States of America and published as International Patent Publication WO 2020/174171 A1 on Sep. 3, 2020, which claims the benefit under Article 8 of the Patent Cooperation Treaty to French Patent Application Serial No. 1901907, filed Feb. 25, 2019.

TECHNICAL FIELD

The present disclosure relates to the field of magnetic position or torque sensors comprising a magnetized part, which is movable relative to a structure for collecting magnetic fluxes toward an air gap in which a magnetically sensitive probe is housed, for example, a Hall probe. The relative displacement can be rotary or linear, or even along any trajectories. Such sensors are used, in particular, in the automotive field, for example, to detect the position of a shaft or the position of a steering column comprising a torsion shaft, or else in the field of robotics.

BACKGROUND

The improved sensitivity of magnetically sensitive probes and the multiplication of sources of electromagnetic interference in the environment where such sensors are used is leading to an increasing problem of reliability of the electrical signal delivered by such sensors. Indeed, this signal is the image not only of the magnetic field produced by the magnetized part of the sensor, but also of all the magnetic and electromagnetic fields coming from external interference sources.

The aim of the present disclosure is to reduce the effect of this interference.

In order to prevent the magnetic sensor from detecting a magnetic flux caused by the external magnetic field, thereby preventing precise detection, patent DE102012014208 proposes a torque sensor detecting a torque generated in a rotating element formed by a first shaft element and a second shaft element, both of which are connected via a torsion bar.

Patent application JP2009020064 is also known, which aims to provide a torque sensor of reduced size and considerably improved efficiency. The torque sensor comprises: first and second shafts, which are coaxially connected via a connection shaft; a ring-shaped permanent magnet fixed to the second shaft and circumferentially magnetized with several poles; a sensor yoke fixed to the first shaft and forming a magnetic circuit with the permanent magnet; a magnetism collector yoke placed on the other side, in the axial direction, of the sensor yoke from the permanent magnet and forming a magnetic circuit with the permanent magnet and the sensor yoke; and a magnetic flux sensor for detecting the magnetic flux induced by the sensor yoke and the magnetism collector yoke. The torque sensor detects, based on an output from the magnetic flux sensor, torque applied to one of the first and second shafts. The sensor yoke is constructed from claw poles arranged on the same plane or substantially on the same plane, and at least some of the claw poles are formed separately from one another.

The solutions that can be envisaged involve increasing the useful magnetic field by increasing the dimensions of the magnet or the Br of the magnet, making it possible to a certain extent to dilute the influence of the interference, but at the cost of a loss of compactness of the sensor and of an increase in cost.

The addition of a shielding located near the probes or constituting a box surrounding the sensor is also a known technique, but involves additional components that are often bulky or even made from an expensive material due to a high permeability. This technique is also often accompanied by a loss of useful magnetic field due to the creation of a leakage path.

The solutions consisting in providing an additional piece of magnetic shielding are not satisfactory because they lead to sensors comprising a higher number of components than the usual sensors and leading to a higher manufacturing and assembly cost.

BRIEF SUMMARY

In order to respond to these drawbacks, the present disclosure aims not to create a magnetic shielding to the external interference field, as the person skilled in the art would be led to do, but to create, on each flux-collecting structure, two collecting zones for this interference field, respectively referred to as a primary collecting zone and a secondary collecting zone, which are arranged in a particular way in relation to the measurement air gap.

The principle of the present disclosure in fact involves bringing the collection field into the measurement air gap, but in two different (e.g., opposing) directions of flow, ultimately making it possible to cancel the overall component of the interference field. From this perspective, it is sought, preferentially but not restrictively, to collect as much interference field with the primary collecting zone as with the secondary collecting zone such that the interference magnetic field collected by each of the two flux-collecting components is brought into the air gap in opposing flow directions with respect to one another, owing to the relative positioning of these two zones, while maximizing the useful flux in this air gap.

More specifically, by positioning a primary collecting zone on one side of the transverse mid-plane defining the air gap and a secondary collecting zone on the other side of the transverse mid-plane defining the air gap, a reversal zone of the magnetic field is created by combining two flux-collecting structures, which reverses the direction of the collected magnetic field crossing the air gap such that the interference magnetic field collected by each of the two flux-collecting components is brought into the air gap in opposing flow directions. The flux collected by the primary and secondary collecting zones of the first collecting structure is canceled out or minimized in cooperation with the flux collected by the primary and secondary collecting zones of the second structure, as will be better appreciated in the different figures.

The present disclosure relates in its most general sense to a position sensor particularly designed to detect torsion in a steering column, made up of a first magnetized magnetic rotor structure comprising a plurality of magnets, of two flux-collecting components, which define at least one air gap in which at least one magnetically sensitive element is positioned, characterized in that each collecting component has at least one primary collecting zone, located in the collecting zone of the magnet flux and extended by at least one extension having at least one secondary collecting zone, in that the secondary collecting zones end in flattened shoes that form the two poles of the air gap, and in that the transverse mid-plane of the air gap intersects at least one of the extensions.

In variant embodiments:
- at least one toothed ring is positioned opposite the magnetized structure;
- the mid-plane is parallel to the planes of the primary collecting zones;
- the primary collecting zones are parallel to the secondary collecting zones;
- the extension extends axially and perpendicularly to the plane of the primary collecting zone beyond the transverse mid-plane;
- the total area of the secondary collecting zone is equal to the total area of the primary collecting zone;
- it further comprises a sensor of the torsion in the column made up of a first magnetized magnetic rotor structure comprising a plurality of magnets, two flux-collecting components, which define at least one air gap in which at least one magnetically sensitive element is positioned, each collecting component having at least one primary collecting zone extended by at least one extension having at least one secondary collecting zone, the secondary collecting zones ending in a flattened shoe forming the two poles of the air gap and the transverse mid-plane of the air gap intersecting at least one of the extensions.

The present disclosure also relates to a device for detecting the absolute position of a steering column, characterized in that it further comprises a sensor of the torsion in the column made up of a first magnetized magnetic rotor structure comprising a plurality of magnets, two flux-collecting components, which define at least one air gap in which at least one magnetically sensitive element is positioned, each collecting component having at least one primary collecting zone extended by at least one extension having at least one secondary collecting zone, the secondary collecting zones ending in a flattened shoe forming the two poles of the air gap and the transverse mid-plane of the air gap intersecting at least one of the extensions.

BRIEF DESCRIPTION OF THE DRAWINGS

The present disclosure will be better understood on reading the detailed description of non-limiting examples of the present disclosure that follows, with reference to the accompanying drawings, in which:

FIG. 4 shows a perspective view of another embodiment of an angular sensor;

FIGS. 5 to 19 all show perspective views of variant embodiments of a sensor according to the present disclosure, which improves several sensors of the prior art;

The magnetic principle will be described with reference to schematic views illustrated in FIGS. 1, 2A, 2B, 2C and 2D as well as with particular reference to an embodiment shown in FIGS. 3A and 3B, which embodiment is chosen as an example. The variant embodiments illustrated in the remaining figures repeat the same principles set out in these first figures.

DETAILED DESCRIPTION

Description of a First Variant Embodiment

Figure 1:
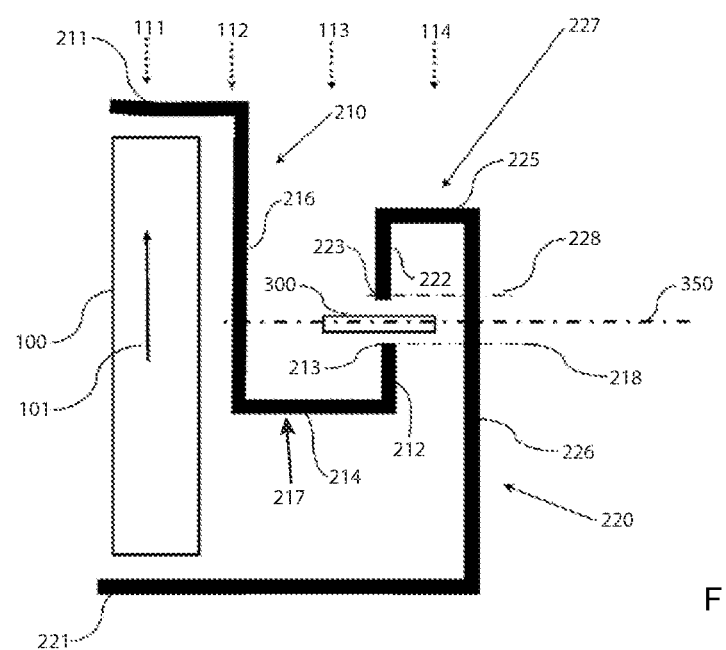
FIG. 1 shows a perspective view of a first schematic example of a sensor according to the present disclosure.

FIG. 1 shows a schematic sectional view of one embodiment of the present disclosure, to illustrate the principle of magnetic operation. The sensor is made up in a known manner of a magnetized structure (100), which is movable relative to a second structure formed by at least two ferromagnetic components (210, 220), made of soft ferromagnetic material constituting main flux collectors and arranged opposite the magnetized structure (100).

The present disclosure applies to any type of combination between a magnetized structure (100) and a second structure, with a relative displacement, which can be linear or angular, and a disc or tubular geometry for measuring a position or an angular torque.

The magnetized structure (100) is determined to modulate the useful induction field (101) passing through the second structure as a function of its position relative to this second structure. To this end, different configurations are known, with, for example: juxtaposition of magnets with an alternation of the direction of magnetization, structure in which magnets are housed, which are polarized in alternating directions, magnet with angularly variable magnetization or with magnetization, which varies in intensity along a trajectory.

This useful induction field (101) is collected by the two soft ferromagnetic components (210, 220) arranged in front of the magnetized structure (100), each comprising a primary flux collecting zone (211, 221) extended by a flux concentration tab (212, 222). The primary flux collecting zones (211, 221) are arranged to be crossed by the useful induction field (101) created by the magnetized structure (100) and by the interference field. For the sake of simplicity in this schematic illustration, no intermediate component is shown, equivalent to the toothed rings (130, 140), which are present in FIGS. 3 to 19 and which serve to improve the collection of the magnetic flux and to direct it toward the primary collecting zones (211, 221).

This induction field (101) is collected by the primary flux collecting zones (211, 221) made from a soft ferromagnetic material, having collecting surfaces, here perpendicular to the direction of the induction field (101)—although this orientation is in no way limiting—, and having a shape corresponding to the area swept by the face of the magnetized structure (100) perpendicular to the main component of the magnetization. These primary flux collecting zones (211, 221) are arranged on either side of the magnetized structure (100). It is specified that the direction of magnetization of the magnetized structure (100) is not limiting and is given here by way of simplified example. The direction of magnetization and the shape of the magnetized structure can be different.

Front ends (213, 223) of the flux concentration tabs (212, 222) define an air gap in which a Hall probe (300) is housed, so as to form a magnetic circuit within which the magnetic field lines circulate. The magnetic induction measured by the Hall probe is a direct function of the magnetic field passing through the primary flux collecting zones (211, 221). Each primary collecting zone (211, 221), respectively, extended by concentration tabs (216, 226) can be produced by cutting and bending a component made from a ferromagnetic material.

The object of the present disclosure is to reduce the incidence of a magnetic interference field, symbolized by the dotted arrows (111 to 114), crossing the primary flux collecting zones (211, 221). These interference fields (111 to 114), which can moreover have different orientations from the vertical one presented here, are collected by the primary flux collecting zones (211, 221) like the useful induction field (101) generated by the magnetized structure (100), and these interference fluxes are therefore found at the measurement probe (300) just like the useful induction field (101). These interference fields are also amplified by the concentration effect due to the soft ferromagnetic material of the collectors and concentrators; therefore, the value measured by the probe will be greater than the interference field applied according to a relationship approximately equal to: Measured induction=(Useful induction+Interference induction)×amplification factor.

The solution proposed by the present disclosure consists in creating a compensation by opposing directions of the interference flux at the measurement probes (300). To this end, secondary collecting zones (214, 225) are provided.

The different variants presented in this document propose, in a non-limiting way, embodiments making it possible to achieve such compensation for the interference fluxes at the air gap in which the measurement probe (300) is positioned. In an optimum embodiment, the interference flux is brought into the air gap in opposing flow directions and is ideally identical to the direct collection of the interference flux in order to have a complete cancellation of the interference at the measurement probes (300), although it is not absolutely necessary, within the framework of the present disclosure, to achieve a perfect cancellation.

In the example illustrated by FIG. 1, the secondary collecting zones (214, 225) are made up of areas oriented parallel to the primary collecting zones (211, 221) and having a cumulative area substantially identical to the cumulative area of the primary collecting zones (211, 221).

The air gap has a mid-plane (350) located between one of the primary collecting zones (211, 221) and one of the concentration zones tabs (218, 228) defined by the front end (213, 223) of the associated flux concentration tab (212, 222). The front end (213, 223) is formed at the end of a curved zone (217, 227) located behind the mid-plane (350), with respect to the primary collecting zone (211, 221), the mid-plane (350) intersecting the concentration tab (216, 226) at a level between the primary collecting zone (211, 221) and the secondary collecting zone (214, 225).

Description of Schematic Variant Embodiments

Figure 2A:
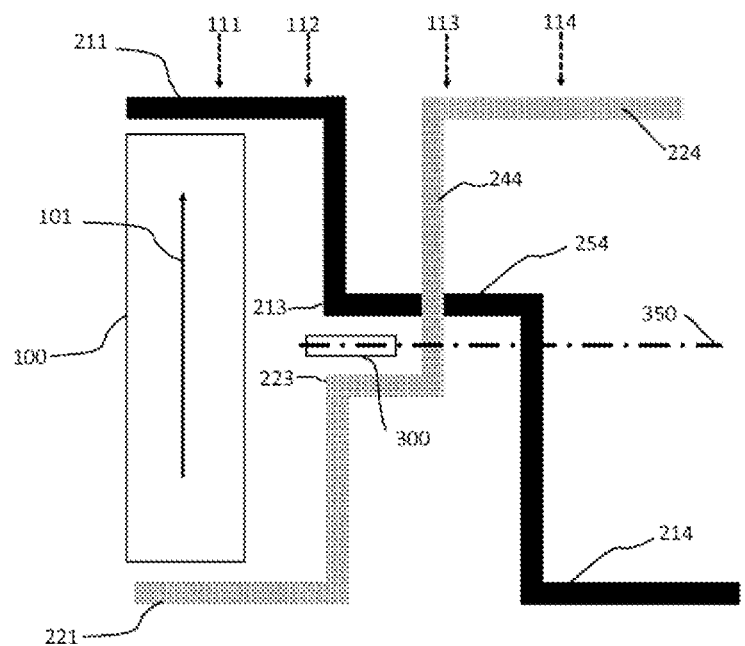
FIGS. 2A, 2B, 2C, 2D 2E and 2F show other schematic examples of a sensor according to the present disclosure.

FIG. 2A shows a schematic sectional view of another embodiment of the present disclosure, to illustrate the principle of magnetic operation. In this example, the reversal of the magnetic interference flux (111 to 114) is carried out by two secondary collecting zones (214, 225), which are connected to the front ends (213, 223) of the primary collecting zones (211, 221) by additional flux concentrators (244, 254) configured to reverse, in the air gap at the probe (300), the direction of the fluxes collected by the secondary collecting zones (214, 224), with respect to the direction of the fluxes collected by the primary collecting zones (211, 221) such that the interference magnetic field is brought into the air gap in opposing flux directions. To do this, at least one of the ferromagnetic components must be such that the measurement air gap is located between a primary collecting zone and a secondary collecting zone of the component.

Figure 2B:
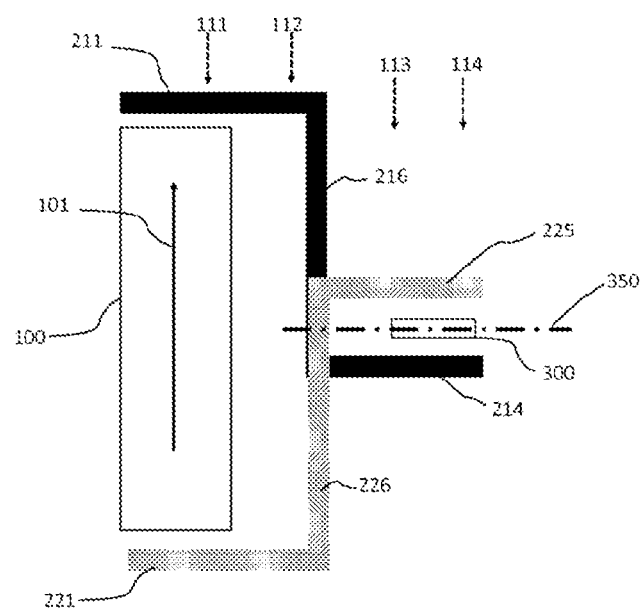

FIG. 2B shows a schematic sectional view of another embodiment of the present disclosure with secondary collecting zones (214, 225). In this version, the primary collecting zones (211, 221) are extended axially by flux concentration tabs (216, 226), which in turn are extended horizontally by the secondary collecting zones (214, 225). The measurement air gap where the probe (300) is positioned is defined between the secondary collecting zones (214, 225). The mid-plane (350) of the air gap is in this example located between the primary collecting zones (211, 221) and the secondary collecting zones (214, 225). The vertical and horizontal orientation of the elements, cited above, is in no way limiting and different orientations can be considered, the aim being to oppose the directions of flow of the interference flux in the measurement air gap.

Figure 2C:
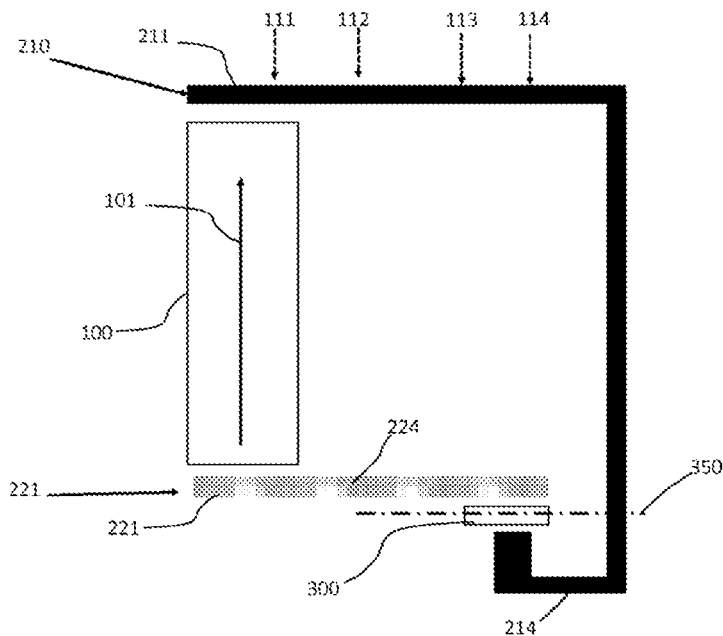

FIG. 2C shows a schematic sectional view of another embodiment of the present disclosure showing that it is only necessary to have at least one ferromagnetic component (210) such that the air gap in which the probe (300) is positioned is located between the primary collecting zone (211) and the secondary collecting zone (214) of the ferromagnetic component (210).

Figure 2D:
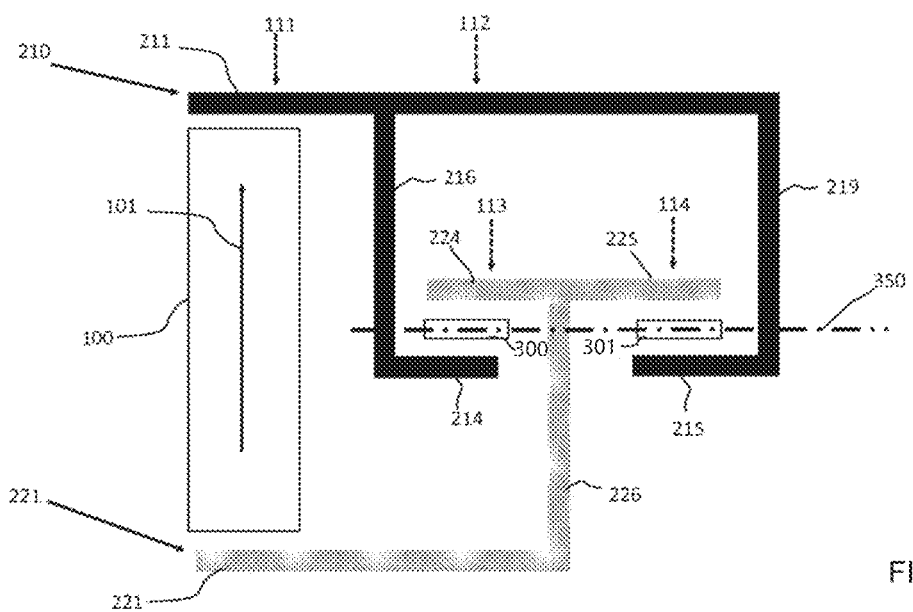

FIG. 2D shows a schematic sectional view of another embodiment of the present disclosure for which two probes (300, 301) are used. This configuration is moreover similar to that shown in a more realistic manner in FIGS. 18A and 18B, the radial positioning of the probes being replaced there by a co-radial positioning of the probes with an angular space between them. The primary collecting zones (211, 221) are, respectively, extended by two and one concentration tabs (216, 219 and 226), which each end with secondary collecting zones (214, 215 and 224, 225). The probes (300, 301) are positioned in the air gaps between the secondary collecting zones (214, 215 and 224, 225). For each ferromagnetic component (210, 220), the air gap is located between the primary collecting zones (211, 221) and the secondary collecting zones (214, 215 and 224, 225).

Figure 2E:
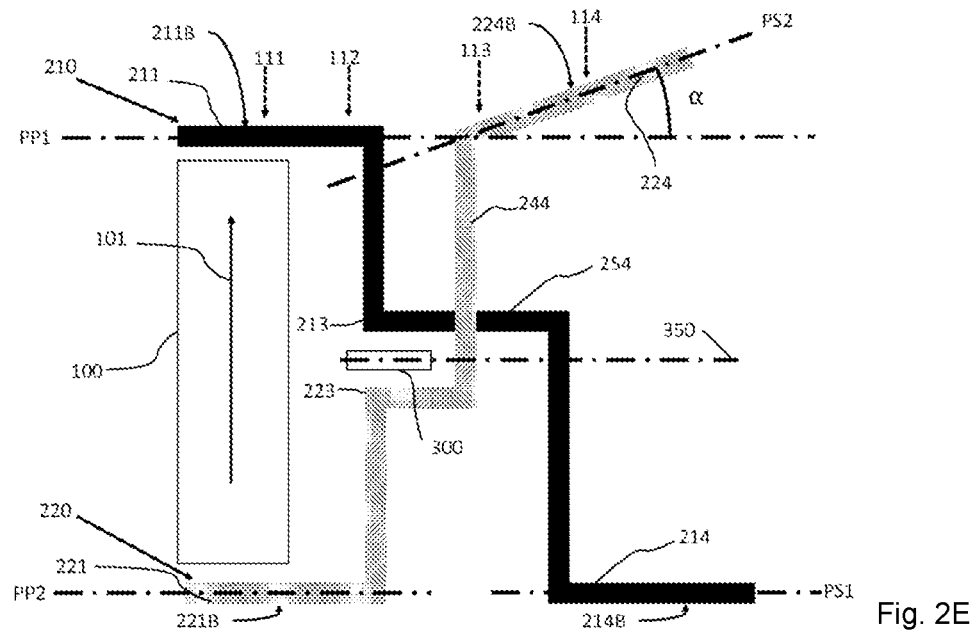

FIG. 2E shows a schematic sectional view of another embodiment of the present disclosure, for which the collecting surfaces (211B, 221B) of the primary collecting zones (211, 221) and the collecting surfaces (214B, 224B) of the secondary collecting zones (214, 224) are defined. This diagram shows a cross-section in a plane orthogonal to the collecting surfaces (211B, 214B, 221B, 224B), which are, respectively, defined by a mid-plane (PP1, PS1, PP2, PS2) at each of these surfaces. This schematic view therefore illustrates that the mid-planes of the surfaces (211B, 221B) of the primary collecting zones (211, 221) are not necessarily parallel to the mid-planes of the collecting surfaces (214B, 224B) of the secondary collecting zones (214, 224); here, the planes (PP1, PS2) form a non-zero angle α. This example is non-limiting and provision is made for any other combination of the planes (PP1, PS1, PP2, PS2), which can form a non-zero angle. However, the compensation is advantageous when the planes (PP1) and (PS2) or (PP2) and (PS1) form a small angle, i.e., α<45 degrees; since the compensation is zero when these combinations both involve orthogonal planes, this possibility is excluded. Finally, the mid-plane is introduced so as to include curved or bumpy collecting surfaces of the collecting zones (211, 214, 221, 224), so the mid-plane of a surface is defined by a minimization at any point of the surface of the distance between the surface and the mid-plane.

Figure 2F:
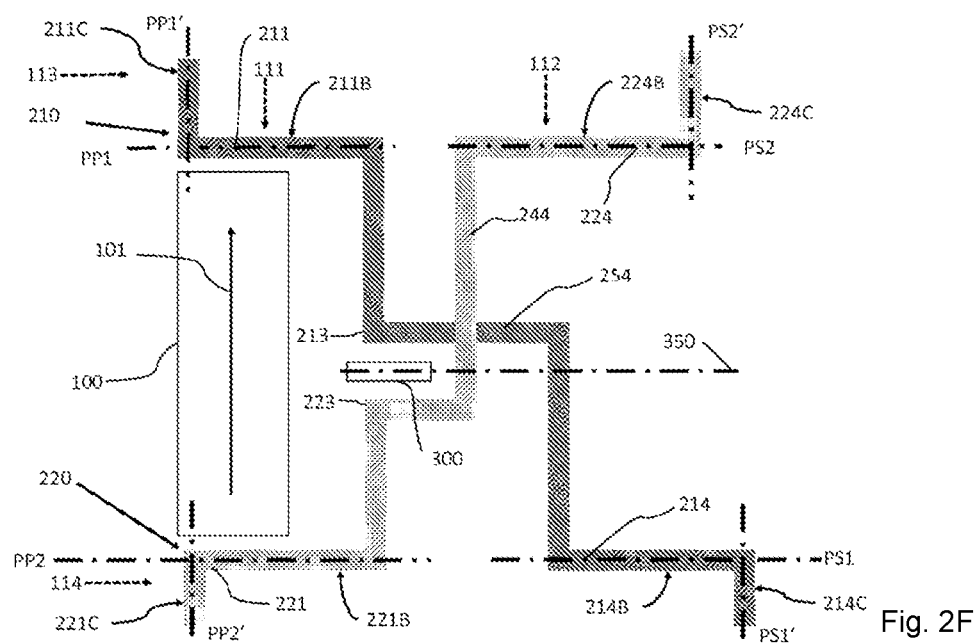

FIG. 2F shows a schematic sectional view of another embodiment of the present disclosure. This embodiment differs from the previous diagram shown in FIG. 2E in that the collecting zones (211, 214, 221, 224) have several collecting surfaces (211B, 211C, 214B, 214C, 221B, 221C, 224B, 224C) for the interference flux. This schematic view is a cross-sectional view along the direction orthogonal to the surfaces. The additional collecting surfaces (211C, 214C, 221C, 224C) of the interference flux are defined by mid-planes (PP1', PS1', PP2', PS2'), respectively, and angular relationships are established between these planes like the relationships defined between the planes (PP1, PS1, PP2, PS2) in the previous embodiment. Thus, if one of the following relationships is true, the planes (PP1') and (PS2') are not orthogonal or the planes (PP2') and (PS1') are not orthogonal. In the remainder of the document, a collecting surface associated with a collecting zone will be designated by a letter A, B, C or D depending on the number identifying the zone. Thus, for the sake of clarity, the diagrams will not systematically show all the collecting zones expressly, the designation of the surface being sufficient to identify the zone.

Description of a First Embodiment of an Angular Sensor

Figure 3A:
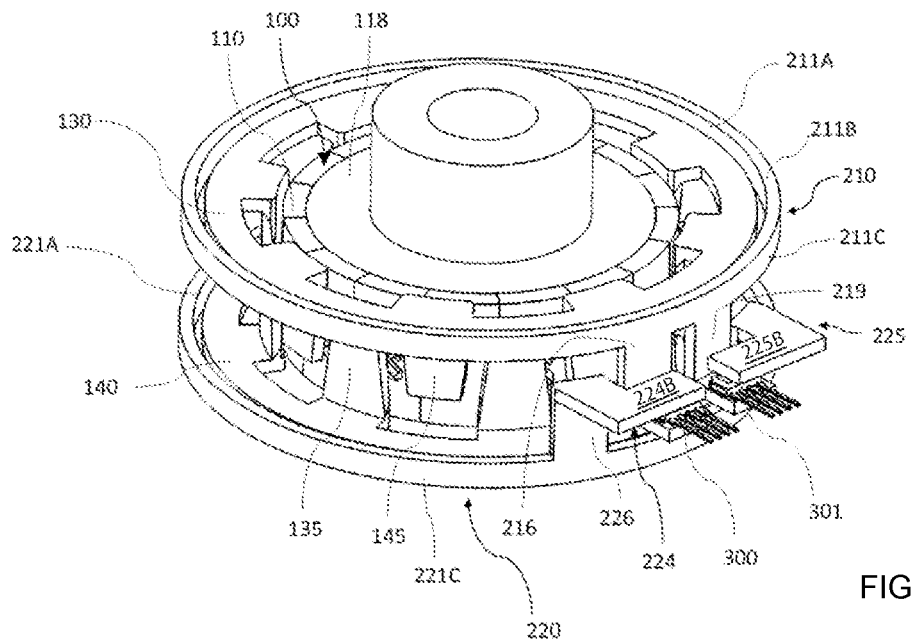
FIGS. 3A and 3B show, in perspective views, respectively, from above and below, a variant of a sensor according to the present disclosure.
Figure 3B:
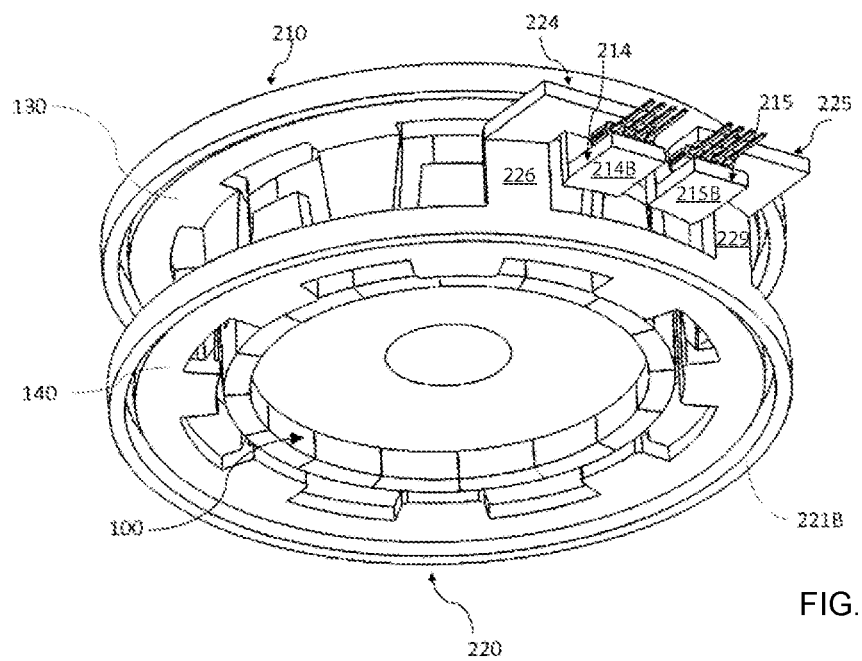

FIGS. 3A and 3B show an embodiment of an angular torsion sensor for performing a measurement over a stroke of a few degrees (typically +/−3°, +/−6°, +/−8°) of a torsion shaft fitted to a steering column. The basis of this sensor is similar to that presented in document US20140130612, a basis that the present disclosure seeks to improve as regards immunity to the magnetic interference field.

The sensor consists of a magnetized structure (100) composed of a cylindrical magnet (110) with 2N pairs of poles (typically N=6, 8, 10 or 12), preferably—but non-limitingly—magnetized radially to form a bushing mounted on a cylindrical yoke (118) of the same height as the magnet.

According to this embodiment, the magnetized structure (100) further comprises two toothed rings (130, 140) mounted facing one another and angularly offset by an angle corresponding to the pole pitch of the magnet (110). Each toothed ring (130, 140) has N teeth (135, 145) in the form of cylinder portions, oriented axially so as to work with the outer faces of the magnet (110). The teeth here show an angular width seen from the axis of the sensor, which increases at the root, so as to increase the flux passage section in the tooth root.

These toothed rings (130, 140) transmit the flux from the magnetized structure (100) to the main collecting zones formed in this example by the ferromagnetic components (210, 220), here in the form of an annulus or a ring, through an annular air gap. The ferromagnetic components (210, 220) have on the one hand a radial collecting surface (211A, 221A) for the useful flux coming from the magnetized structure (100), and on the other hand an axial collecting surface (211B, 221B) collecting part of the useful flux, but above all the outside interference flux. The exterior surfaces (211C, 221C) mainly participate in collecting the interference flux.

The ferromagnetic components (210, 220) are each extended by two concentration tabs (216, 219 and 226, 229), respectively, and make it possible to concentrate and direct the flux in two measurement air gaps, which are located radially outside the concentration tabs (216, 218 and 226, 228) and in which two magnetically sensitive elements (300, 301) are positioned and maintained by a printed circuit, not shown. The number of air gaps and magnetically sensitive elements used in this example—but more generally in all the presented examples—can be variable depending on the redundancies of the desired signal. There may in fact be one, two or three probes typically used in these sensors.

Secondary collecting zones (224, 225) of the ferromagnetic component (220) are formed by two upper transverse areas (224B, 225B) extending in a plane parallel to the planes of the collecting surface (221B) and located behind the transverse mid-plane passing through the air gaps in which the Hall probes (300, 301) are placed. This mid-plane is thus placed between:

the plane of the primary collecting surface (221B) extended by the associated concentration tabs (226, 229), the plane of the associated secondary collecting surfaces (224B, 225B), parallel to the plane of the primary collecting surface (221B).

These three surfaces (221B, 224B, 225B) are parallel in the described example, although they or one of them may be inclined without departing from the scope of the present disclosure. The mid-plane of the air gaps intersects the concentration tabs (226, 229).

Similarly, secondary collecting zones (214, 215) of the ferromagnetic component (210) are formed by two upper transverse areas (214B, 215B) extending in a plane parallel to the planes of the primary collecting surface (211B) and located behind the transverse mid-plane passing through the air gaps in which the Hall probes (300, 301) are placed. This mid-plane is thus placed between:

the plane of the primary collecting surface (211B) extended by the associated concentration tabs (216, 219), the plane of the associated secondary collecting surfaces (214B, 215B), parallel to the plane of the primary collecting surface (211B).

These three surfaces (211B, 214B, 215B) are parallel in the described example, although they or one of them can be inclined without departing from the scope of the present disclosure. The mid-plane of the air gaps intersects the concentration tabs (216, 219).

Description of Several Embodiments of an Angular Sensor

FIG. 4 illustrates the application of the present disclosure to a sensor as presented in document US20140283623. Like before, this sensor comprises a magnetized structure (100), which is movable relative to toothed rings (130, 140) directing the flux toward the ferromagnetic concentration components (210, 220) and a measurement air gap in which here a single probe (300) is located.

The ferromagnetic components (210, 220) are formed by a primary collecting surface (211A, 221A), which, on its interior, collects the useful flux of the magnetized structure (100) and the external interference flux on its edge and its exterior. The primary collecting surfaces (211B, 221B) mainly collect the axial component of the interference flux, these surfaces being extended by concentration tabs (216, 226) until they form secondary collecting zones (214, 224) at their end, between which zones the probe (300) is positioned. The interference flux is on the one hand directed into the air gap in the direct direction between the secondary collecting zones (214, 225) and in the opposite direction through the collecting zones (211B, 221B), all participating in minimizing or even canceling the interference flux in the measurement air gap.

FIGS. 5A and 5B illustrate the application of the present disclosure to a sensor as presented in document US20090027045. Like before, this sensor comprises a magnetized structure (100), which is movable relative to toothed rings (130, 140) directing the flux toward the ferromagnetic concentration components (210, 220) and a measurement air gap in which one or two probes (300, 301) are located. The teeth (135, 145) of the rings (130, 140) here extend radially and not axially as previously shown in FIG. 4. FIG. 5A has a single measurement probe (300), and FIG. 5B has two probes (300, 301), the functions otherwise remaining identical between the two sub-variants.

The ferromagnetic components (210, 220) are formed by a primary collecting surface (211A, 221A), which, on its interior, collects the useful flux of the magnetized structure (100) and the external interference flux on its exterior. Primary collecting surfaces (211B, 221B) of the primary collecting zones (211, 221) collect the useful flux and the interference flux, these surfaces being extended by concentration tabs (216, 226) until they form secondary collecting zones (214, 224, 215, 225) at their end, between which zones the probes (300, 301) are positioned. The interference flux is on the one hand directed into the air gap in the direct direction between the secondary collecting zones (214, 224, 215, 225) and in the opposite direction through the collecting zones (211, 216, 221, 226), all participating in minimizing or even canceling the interference flux in the measurement air gap.

Figure 6:
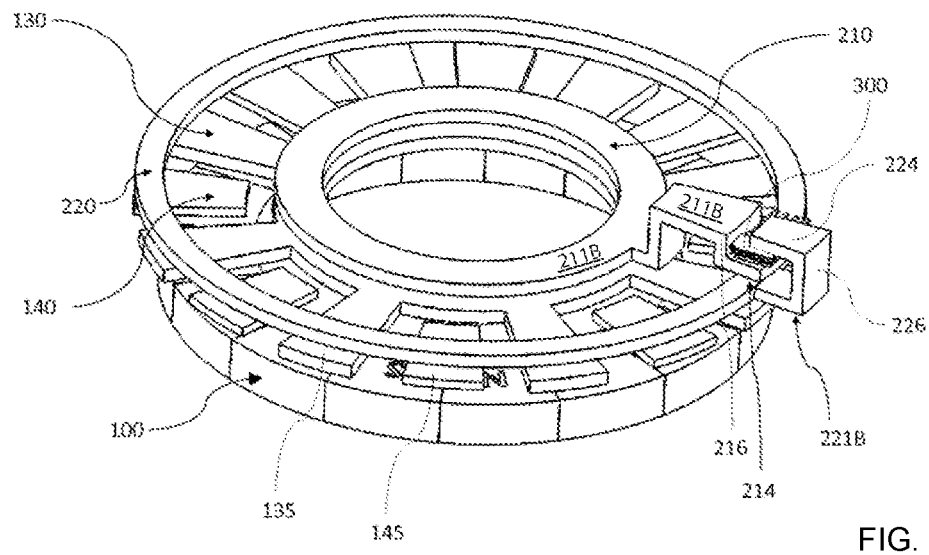

FIG. 6 illustrates the application of the present disclosure to a sensor as presented in document JP200920064. Like before, this sensor comprises a magnetized structure (100), which is movable relative to toothed rings (130, 140) directing the flux toward the ferromagnetic concentration components (210, 220) and a measurement air gap in which here a single probe (300) is located. In this example, the magnetized structure is positioned under the toothed rings (130, 140).

The ferromagnetic components (210, 220) are formed by a primary collecting surface (211B, 221B), which, on its interior, collects the useful flux of the magnetized structure (100) and the external interference flux on its exterior. These surfaces (211B, 221B) are extended by concentration tabs (216, 226) until they form secondary collecting zones (214, 224) at their end, between which zones the probe (300) is positioned. The interference flux is on the one hand directed into the air gap in the direct direction between the secondary collecting zones (214, 224) and in the opposite direction through the collecting zones (211B, 216, 221B, 226), all participating in minimizing or even canceling the interference flux in the measurement air gap.

Figure 7:
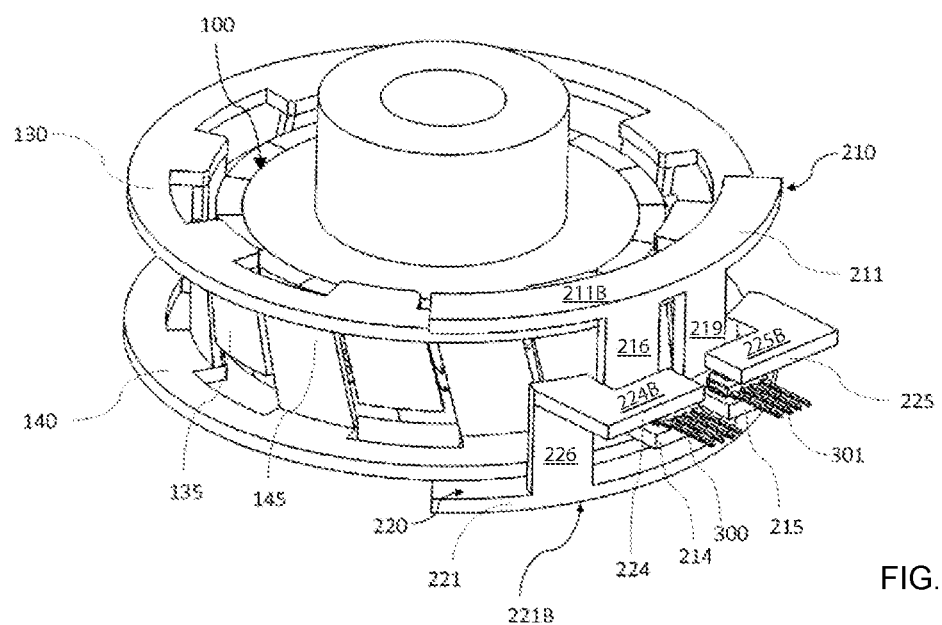

FIG. 7 illustrates the application of the present disclosure to a sensor as presented in document KR20120010696. Like before, this sensor comprises a magnetized structure (100), which is movable relative to toothed rings (130, 140) directing the flux toward the ferromagnetic concentration components (210, 220) and a measurement air gap in which here a single probe (300) is located. In this example, the teeth (135, 145) of the rings (130, 140) are angularly inclined.

The ferromagnetic components (210, 220) are formed by collecting surfaces (211B, 221B) of the primary collecting zones (211, 221), which collect the useful flux of the magnetized structure (100) on their interior and the interference flux on their exterior. These surfaces (211B, 221B) are extended by concentration tabs (216, 219, 226) until they form secondary collecting zones (214, 215, 224, 225) at their end, between which zones the probes (300, 301) are positioned. The interference flux is on the one hand directed into the air gap in the direct direction between the secondary collecting zones (214, 215, 224, 225) and in the opposite direction through the collecting zones (211, 216, 219, 221B, 226), all participating in minimizing or even canceling the interference flux in the measurement air gap.

Figure 8:
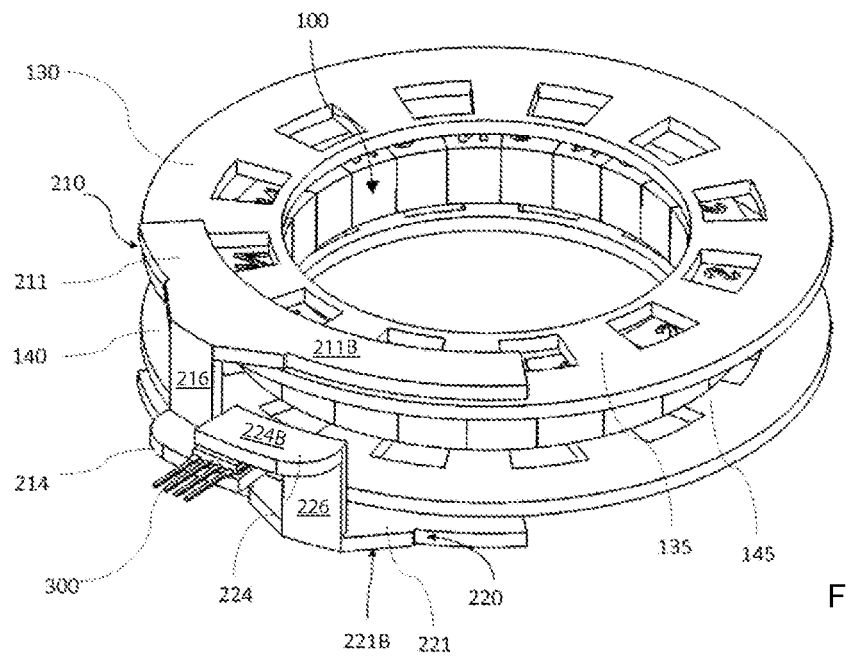

FIG. 8 illustrates the application of the present disclosure to a sensor as presented in document JP2012058249. Like before, this sensor comprises a magnetized structure (100), which is movable relative to toothed rings (130, 140) directing the flux toward the ferromagnetic concentration components (210, 220) and a measurement air gap in which here a single probe (300) is located. In this example, the rings (130, 140) are flat and do not have cut teeth, and the collection of useful flux is done axially, similarly to the schematic view of FIG. 1.

The ferromagnetic components (210, 220) are formed by primary collecting surfaces (211B, 221B), which collect the useful flux of the magnetized structure (100) on their interior and the exterior interference flux on their exterior. These surfaces (211B, 221B) are extended by concentration tabs (216, 226) until they form secondary collecting zones (214, 224) at their end, between which zones the probe (300) is positioned. The interference flux is on the one hand directed into the air gap in the direct direction between the secondary collecting zones (214, 224) and in the opposite direction through the collecting zones (211B, 221B, 216, 226), all participating in minimizing or even canceling the interference flux in the measurement air gap.

Figure 9:
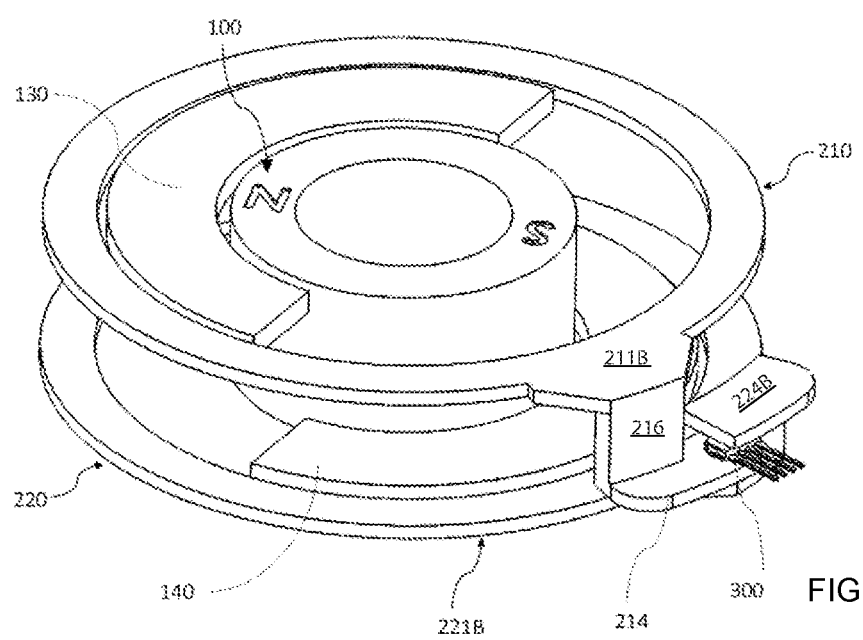

FIG. 9 illustrates the application of the present disclosure to a sensor as presented in document JP2016090492. Like before, this sensor comprises a magnetized structure (100), which is movable relative to rings (130, 140) directing the flux toward the ferromagnetic concentration components (210, 220) and a measurement air gap in which here a single probe (300) is located. In this example, the rings (130, 140) are flat and do not have teeth.

The ferromagnetic components (210, 220) are formed by primary collecting surfaces (211B, 221B), which collect the useful flux of the magnetized structure (100) on their interior and the exterior interference flux on their exterior. These surfaces (211B, 221B) are extended by concentration tabs (216, 226, not visible) until they form secondary collecting zones (214, 224) at their end, between which zones the probe (300) is positioned. The interference flux is on the one hand directed into the air gap in the direct direction between the secondary collecting zones (214, 224) and in the opposite direction through the collecting zones (211, 216, 226, 221), all participating in minimizing or even canceling the interference flux in the measurement air gap.

Figures 10, 11:
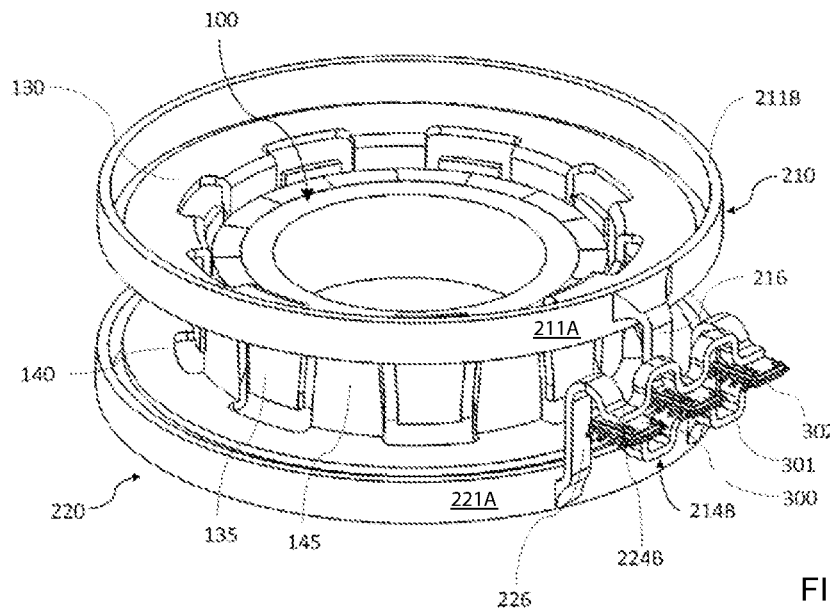

FIG. 10 illustrates the application of the present disclosure to a sensor as presented in document US20090078058. Like before, this sensor comprises a magnetized structure (100), which is movable relative to rings (130, 140) directing the flux toward the ferromagnetic concentration components (210, 220) and a measurement air gap in which here three probes (300, 301, 302) are located. In this example, the ferromagnetic components (210, 220) have a greater axial thickness than the toothed rings (130, 140).

The ferromagnetic components (210, 220) are formed by primary collecting surfaces (211A, 221A), which collect the useful flux of the magnetized structure (100) on their interior and the interference flux on the edge and their exterior. These collecting surfaces (211A, 221A) are extended by concentration tabs (216, 226) until they form secondary collecting zones (214, 224) at their end, between which zones here the three probes (300, 301, 302) are positioned. The interference flux is on the one hand directed into the air gap in the direct direction between the secondary collecting zones (214, 224) and in the opposite direction through the collecting zones (211, 221), all participating in minimizing or even canceling the interference flux in the measurement air gap.

FIG. 11 illustrates the application of the present disclosure to a sensor as presented in document KR976701. Like before, this sensor comprises a magnetized structure (100), which is movable relative to rings (130, 140) directing the flux toward the ferromagnetic concentration components (210, 220) and a measurement air gap in which here two probes (300, 301) are located. In this example, the toothed rings (130, 140) are doubled to increase the useful flux collecting surface.

The ferromagnetic components (210, 220) are formed by primary collecting zones (211, 221) collecting the useful flux of the magnetized structure (100) on their interior collecting surface (211A, 221A) and the interference flux on their exterior surface (211B, 221B). These surfaces (211B, 221B) are extended by concentration tabs (216, 219, 226) until they form secondary collecting zones (214, 215, 224, 225) at their end, between which zones here two probes (300, 301) are positioned. The interference flux is on the one hand directed into the air gap in the direct direction between the secondary collecting zones (214, 215, 224, 225) and in the opposite direction through the collecting zones (211, 221), all participating in minimizing or even canceling the interference flux in the measurement air gap.

Figures 12A, 12B:
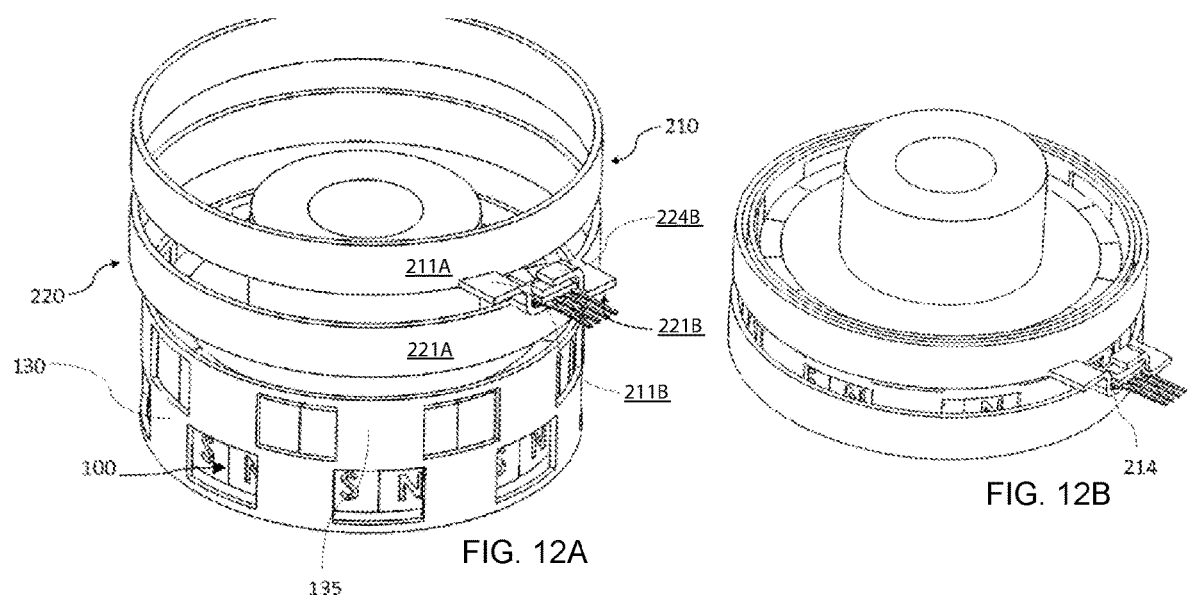

FIGS. 12A and 12B illustrate the application of the present disclosure to a sensor as presented in document KR987896. Like before, this sensor comprises a magnetized structure (100), which is movable relative to a single ring (130) directing the flux toward the ferromagnetic concentration components (210, 220) and a measurement air gap in which here a single probe (300) is located. In this example, the ring (130) is unique and does not have cut teeth. FIG. 12A shows an exploded view of the sensor, and FIG. 12B shows an assembled view of the sensor.

The ferromagnetic components (210, 220) are formed by primary collecting surfaces (211A, 221A), which collect the useful flux of the magnetized structure (100) and the interference flux on the edge and their exterior. These collecting surfaces (211A, 221A) are extended by surfaces (211B, 221B) and next by concentration tabs (216, 219, 226) until they form secondary collecting zones (214, 224) at their end, between which zones, a probe (300) is positioned. The interference flux is, on the one hand, directed into the air gap in the direct direction between the secondary collecting zones (214, 224) and in the opposite direction through the collecting surfaces (211A, 211B, 221A, 221B), all participating in minimizing or even canceling the interference flux in the measurement air gap.

Figure 13:
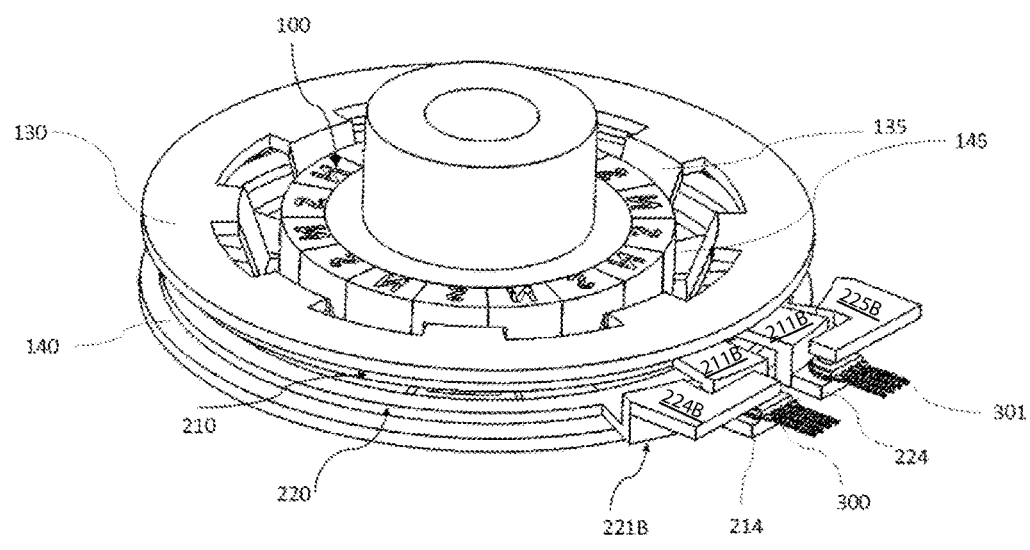

FIG. 13 illustrates the application of the present disclosure to a sensor as presented in document WO2016032785. Like before, this sensor comprises a magnetized structure (100), which is movable relative to rings (130, 140) directing the flux toward the ferromagnetic concentration components (210, 220) and a measurement air gap in which here two probes (300, 301) is located. In this example, the toothed rings (130, 140) have teeth (135, 145), which are inclined radially.

The ferromagnetic components (210, 220) are in the form of annuluses and are formed by primary collecting surfaces (211B, 221B), which collect the useful flux of the magnetized structure (100) and the interference flux on their exterior. These surfaces (211B, 221B) are extended by concentration tabs (not referenced) until forming secondary collecting zones (214, 215, 224, 225) at their ends, between which zones here two probes (300, 301) are positioned. The interference flux is, on the one hand, directed into the air gap in the direct direction between the secondary collecting zones (214, 215, 224, 225) and in the opposite direction through the collecting zones (211B, 221B), all participating in minimizing or even canceling the interference flux in the measurement air gap.

Figure 14:
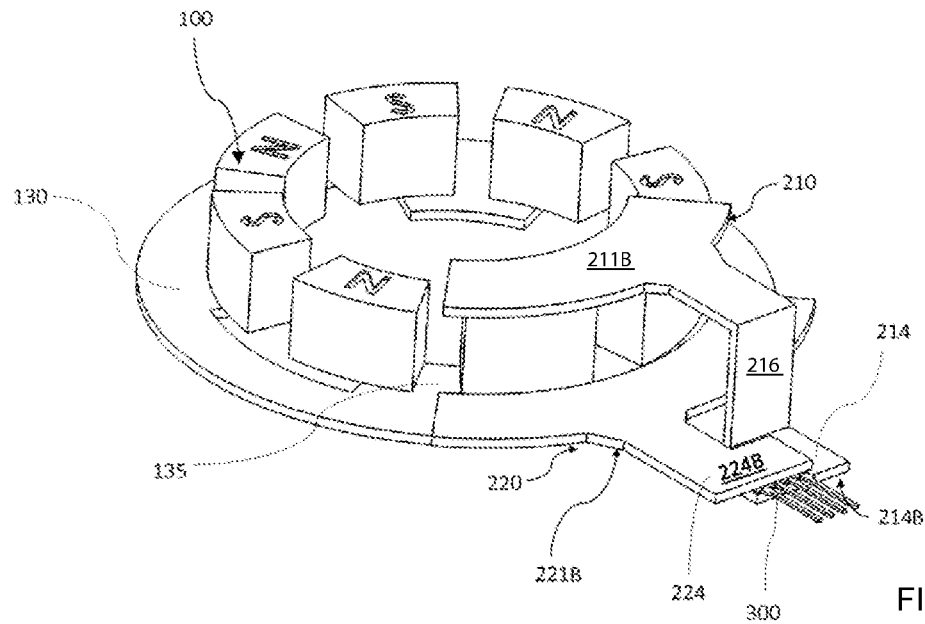

FIG. 14 illustrates the application of the present disclosure to a sensor as presented in document KR2016029991. Like before, this sensor comprises a magnetized structure (100), which is movable relative to a ring (130) directing the flux toward the ferromagnetic concentration components (210, 220) and a measurement air gap in which here a probe (300) is located. In this example, the ring (130) is unique and has teeth (135), which extend radially.

The ferromagnetic components (210, 220) are in the form of sectors and are formed by primary collecting surfaces (211B, 221B), which collect the useful flux of the magnetized structure (100) on their interior and the interference flux on their exterior. The surface (211B) is extended by a concentration tab (216) until it forms secondary collecting zones (214, 224) between which here a probe (300) is positioned. The interference flux is on the one hand directed into the air gap in the direct direction between the secondary collecting zones (214, 224) and in the opposite direction through the collecting zones (211, 221), all participating in minimizing or even canceling the interference flux in the measurement air gap.

Figure 15:
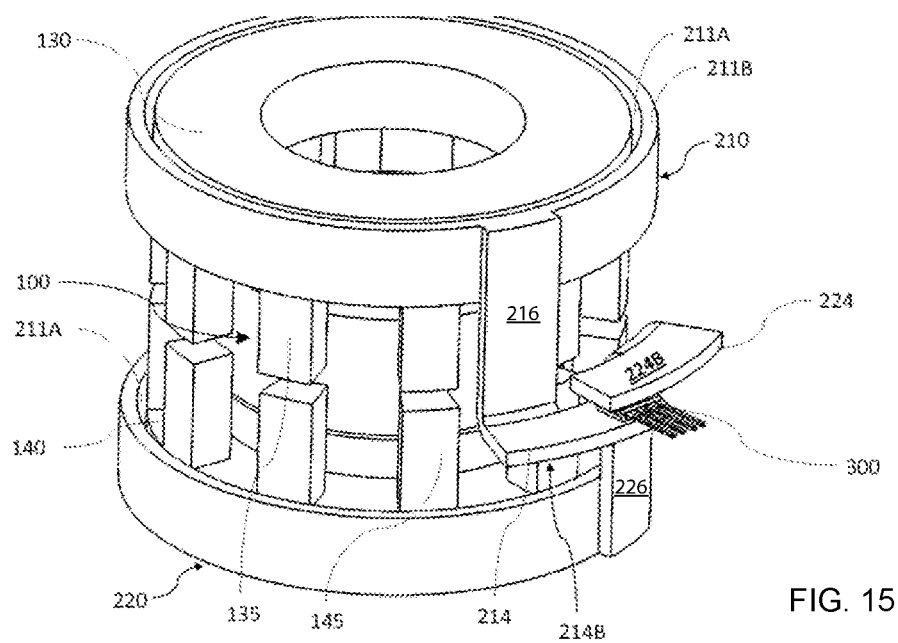

FIG. 15 illustrates the application of the present disclosure to a sensor as presented in document JP6036220. Like before, this sensor comprises a magnetized structure (100), which is movable relative to two rings (130, 140) directing the flux toward the ferromagnetic concentration components (210, 220) and a measurement air gap in which here a probe (300) is located. In this example, the teeth (135, 145) of the rings (130, 140) extend axially and are collinear between each ring (130, 140). The magnetized structure (100) is axially polarized.

The ferromagnetic components (210, 220) are in the form of sectors and are formed by primary collecting zones (211, 221), which collect the useful flux of the magnetized structure (100) on the collecting surfaces (211A, 221A) and the interference flux on the collecting surfaces (211B, 221B). The collecting zones (211, 221) are extended by a concentration tab (216, 226) until it forms secondary collecting zones (214, 224) at its end, between which zones here a probe (300) is positioned. The interference flux is on the one hand directed into the air gap in the direct direction between the secondary collecting zones (214, 224) and in the opposite direction through the collecting zones (211, 221), all participating in minimizing or even canceling the interference flux in the measurement air gap.

Figure 16:
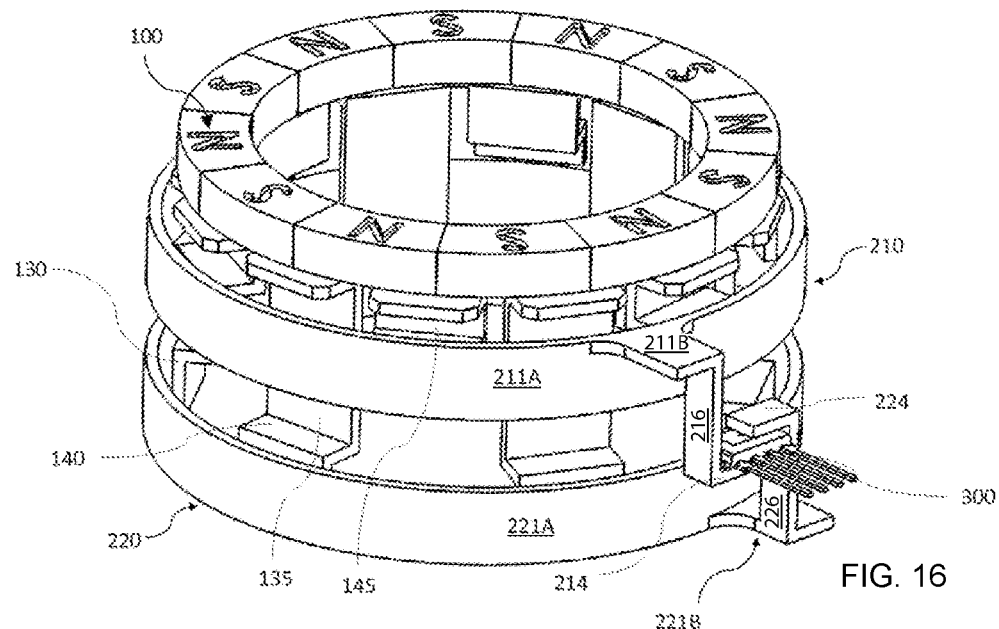

FIG. 16 illustrates the application of the present disclosure to a sensor as presented in document US20160138983. Like before, this sensor comprises a magnetized structure (100), which is movable relative to two toothed rings (130, 140) directing the flux toward the ferromagnetic concentration components (210, 220) and a measurement air gap in which here a probe (300) is located. In this example, the teeth (135, 145) of the rings (130, 140) together make up the rings (130, 140). The magnetized structure (100) is axially polarized and is located above the rings (130, 140).

The ferromagnetic components (210, 220) are in the form of sectors and are formed by primary collecting zones (211, 221), which collect the useful flux of the magnetized structure (100) on the collecting surfaces (211A, 221A) and the interference flux on the collecting surfaces (211B, 221B).

The collecting zones (211, 221) are extended by a concentration tab (216, 226) until it forms secondary collecting zones (214, 224) at its end, between which zones here a probe (300) is positioned. The interference flux is on the one hand directed into the air gap in the direct direction between the secondary collecting zones (214, 224) and in the opposite direction through the collecting zones (211, 221, 216, 226), all participating in minimizing or even canceling the interference flux in the measurement air gap.

Figure 17:
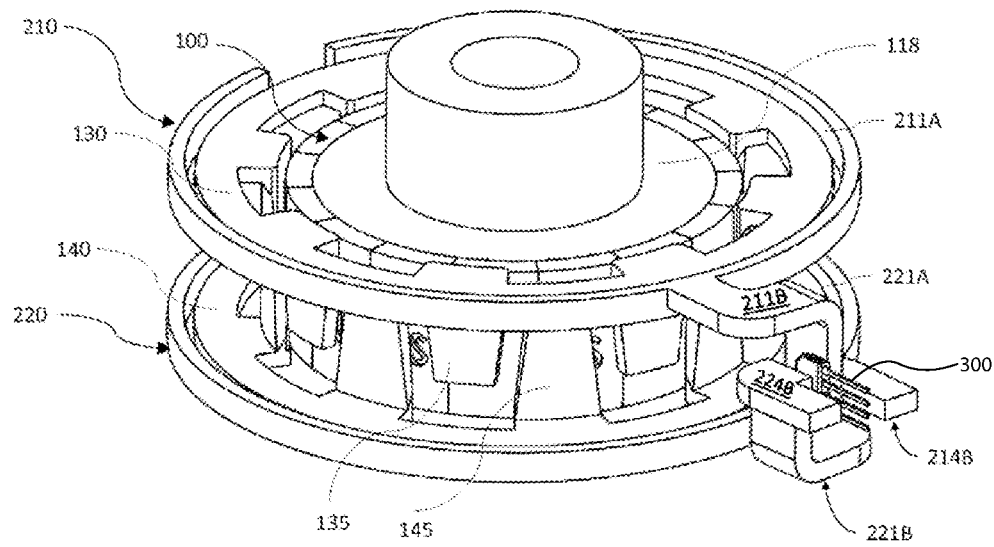

FIG. 17 illustrates the application of the present disclosure to a sensor whose probe plane (300) is oriented axially or at 90° with respect to the preceding descriptions. Like before, this sensor comprises a magnetized structure (100), which is movable relative to two toothed rings (130, 140) directing the flux toward the ferromagnetic concentration components (210, 220) and a measurement air gap in which a probe (300) is located. In this example, the teeth (135, 145) of the rings (130, 140) together make up the rings (130, 140). The solution provided by the present disclosure also makes it possible to minimize the interference of an external field oriented perpendicular to the axis of rotation of the sensor.

The ferromagnetic components (210, 220) are in the form of sectors and are formed by primary collecting surfaces (211A, 221A), which collect the useful flux of the magnetized structure (100). The surfaces (211B, 221B) are extended at their end by secondary collecting zones (214, 224) between which a probe (300) is positioned here. The interference flux is, on the one hand, directed into the air gap in the direct direction between the secondary collecting zones (214, 224) and in the opposite direction through the collecting zones (211B, 221B), participating in minimizing or even canceling the interference flux in the measurement air gap.

FIGS. 18A and 18B illustrate the application of the present disclosure to a sensor as described in document U.S. Pat. No. 8,418,570. Like before, this sensor comprises a magnetized structure (100), which is movable relative to two toothed rings (130, 140) directing the flux toward the ferromagnetic concentration components (210, 220) and a measurement air gap in which here two probes (300, 301) are located. In this example, the ferromagnetic components (210, 220) are in two parts generating an additional air gap (500, 501). FIG. 18A is a complete view of the device, while FIG. 18B is a view where the ferromagnetic components (210, 220) are truncated in an axial plane to better appreciate the shape of the elements.

The ferromagnetic components (210, 220) are in the form of sectors and are formed by primary collecting surfaces (211, 221), which collect the useful flux of the magnetized structure (100) on their interior collecting surfaces (211A) and the interference flux on the edge of their surface (211B, 221B) and their exterior surface (211C, 221C). The collecting zones (211, 221) are extended at their end by secondary collecting zones (214, 215, 224, 225), between which here two probes (300) are positioned. The interference flux is on the one hand directed into the air gap in the direct direction between the secondary collecting zones (214, 215, 224, 225) and in the opposite direction through the collecting zones (211, 221), all participating in minimizing or even canceling the interference flux in the measurement air gap.

FIG. 19 illustrates the application of the present disclosure to a sensor as described in document JP2016095281. The ferromagnetic components (210, 220) are in the form of annuluses and are formed by primary collecting surfaces (211B, 221B), which collect the useful flux of the magnetized structure (100) and the interference flux. The surfaces (211B, 221B) are extended by concentration tabs (216, 226) and at their end by secondary collecting zones (214, 224) between which a probe (300) is positioned here. The interference flux is on the one hand directed into the air gap in the direct direction between the secondary collecting zones (214, 224) and in the opposite direction through the collecting zones (211B, 221B), all participating in minimizing or even canceling the interference flux in the measurement air gap.

Figure 20:
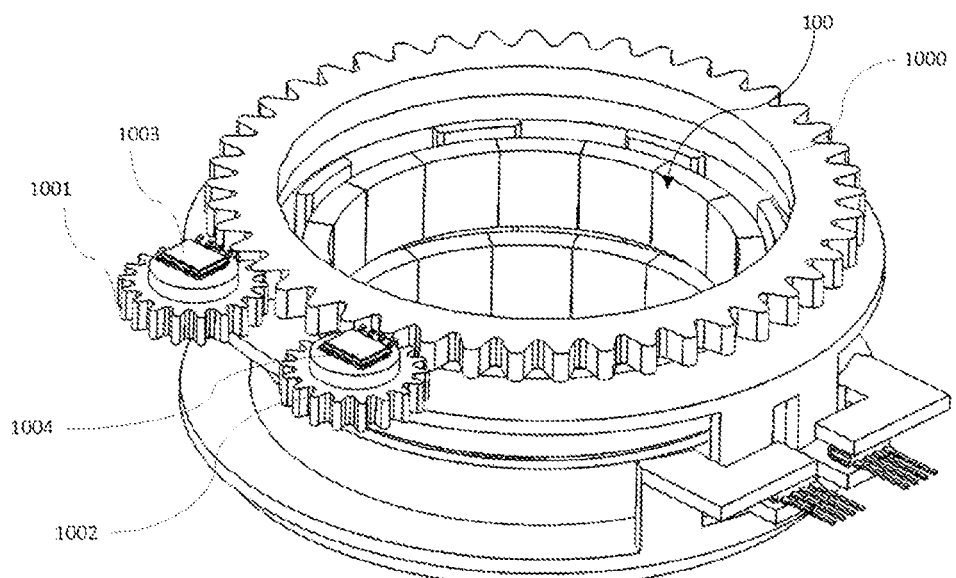
FIG. 20 shows a perspective view of one embodiment of an angular sensor according to the present disclosure associated with an absolute position sensor.

FIG. 20 shows the combination of a position sensor as defined by the present disclosure with an absolute position detection device. In this non-limiting example, a position sensor as defined in FIGS. 3A, 3B is associated with a device similar to that described in document WO2012084288. The latter device, using a principle of measurement by magnetic vernier, is intended to determine the absolute position over several turns of the steering column. The vernier-type device, in particular, comprises a main toothed wheel (1000), which is preferably secured to the magnetized structure (100). The rotation of the steering column therefore causes the rotation of the main toothed wheel (1000), which in turn causes the rotation of the magnetized planet wheels (1001, 1002), which brings about the evolution of the signal at the magnetically sensitive probes (1003, 1004). It is thus possible to obtain an absolute angular position of the steering column over several rotations of this column.

It can of course be envisaged to use any variant of the position sensor according to the present disclosure with any absolute position detection device, this example of FIG. 20 not being limiting in any way in its embodiment.

Figure 21:
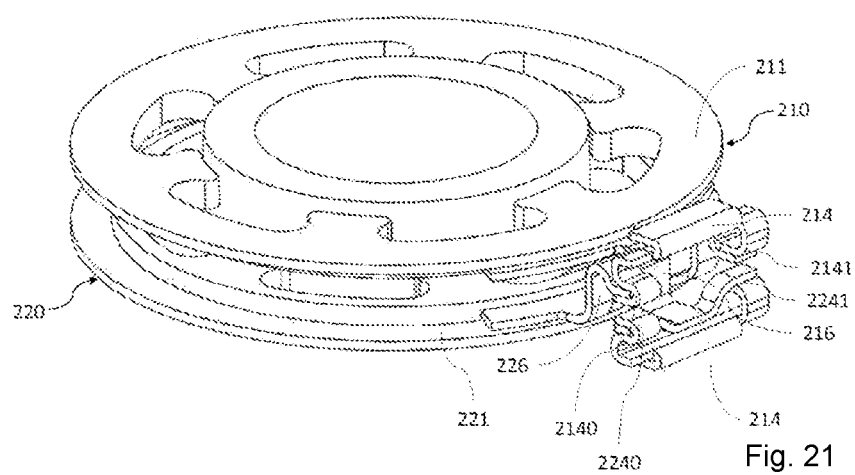
FIGS. 21-22 show methods of attaching the primary collecting zones to the secondary collecting zones.
Figure 22:
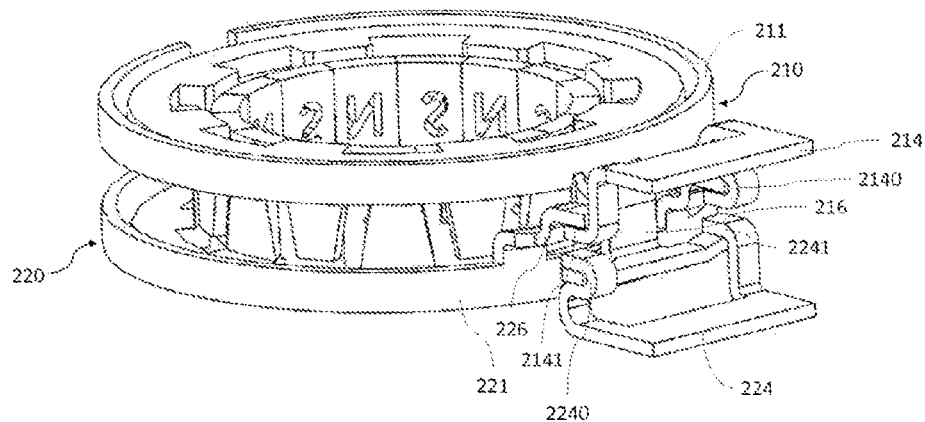

FIGS. 21 and 22 illustrate structures showing embodiments for the mechanical and magnetic connection between the secondary collecting zones (214, 224) and the primary collecting zones (211, 221). On one of the sides, the secondary collecting zones (214, 224) have curved U-shaped parts (2140, 2240) at their ends allowing a connection by "clipping" on a flat end of the concentration tabs (216, 226). On the other side, the secondary collecting zones (214, 224) have a flat surface (2141, 2241) in contact with a flat end of the concentration tabs (216, 226) allowing a connection by welding at the contact. The U shape not being limiting, it is possible to imagine other clipping modes using complementary shapes guaranteeing maintenance by mechanical deformation.

It may of course be envisaged to use any combination of the fixing methods presented or suggested, the use of different fixing methods in FIGS. 21 and 22 only being intended to illustrate the variety.

The invention claimed is:

1. A position sensor for detecting torsion in a steering column, comprising:
   a first magnetized magnetic rotor structure comprising a plurality of magnets;
   two flux-collecting components defining at least one air gap, the flux-collecting components collecting fluxes of a measured magnetic field and of an interference magnetic field, each flux-collecting component having at least one primary collecting zone extended by at least one extension having at least one secondary collecting zone, the secondary collecting zones ending with at least substantially planar axial extension portions forming a first magnetic pole and a second magnetic pole of the air gap, a transverse mid-plane of the air gap intersecting at least one of the extensions, the at least one primary collecting zone and the at least one secondary collecting zone of the two flux-collecting components being positioned respectively on either side of the transverse mid-plane such that the interference magnetic field collected by each of the two flux-collecting components is brought into the air gap in an opposing magnetic field direction from the magnetic field direction of the collecting zone, the at least one primary collecting zone of the first flux-collecting component having at least one collecting surface with a first mid-plane (PP1), the at least one primary collecting zone of the second flux-collecting component having at least one collecting surface with a second mid-plane (PP2), an at least one secondary collecting zone for creating the opposing interference magnetic field direction of the first flux-collecting component having at least one collecting surface for the first flux-collecting component having a third mid-plane (PS1), an at least one secondary collecting zone for creating the opposing interference magnetic field direction of the second flux-collecting component having at least one collecting surface for the second flux-collecting component having a fourth mid-plane (PS2), wherein the first mid-plane (PP1) is not perpendicular to the fourth mid-plane (PS2) or the second mid-plane (PP2) is not perpendicular to the third mid-plane (PS1); and at least one magnetically sensitive element positioned in the at least one air gap.

2. The position sensor of claim 1, further comprising at least one toothed ring positioned opposite the magnetized magnetic rotor structure.

3. The position sensor of claim 1, wherein the transverse mid-plane of the air gap is parallel to the planes of the at least one primary collecting zones.

4. The position sensor of claim 1, wherein the at least one primary collecting zone has an additional surface configured to collect a measured magnetic flux coming from the magnetized magnetic rotor structure.

5. The position sensor of claim 1, wherein the at least one primary collecting zone of the first flux-collecting component has at least one additional collecting surface with a fifth mid-plane (PP1'), the at least one primary collecting zone of the second flux-collecting component has at least one additional collecting surface with a sixth mid-plane (PP2'), the at least one secondary collecting zone of the first flux-collecting component has at least one additional collecting surface with a seventh mid-plane (PS1'), and the at least one secondary collecting zone of the second flux-collecting component has at least one additional collecting surface with an eighth mid-plane (PS2'), wherein the fifth mid-plane PP1' is not perpendicular to the eight mid-plane (PS2') or the sixth mid-plane (PP2') is not perpendicular to the eighth mid-plane (PS2').

6. The position sensor of claim 1, wherein the extension extends axially and perpendicular to the plane of the at least one primary collecting zone beyond the transverse mid-plane of the air gap.

7. The position sensor of claim 1, wherein a total area of the secondary collecting zone is equal to a total area of the at least one primary collecting zone.

8. A device for detecting an absolute position of a steering column, comprising a torsion sensor including:
a first magnetized magnetic rotor structure comprising a plurality of magnets;
two flux-collecting components, which define at least one air gap, the flux-collecting components collecting fluxes of a measured magnetic field and of an interference magnetic field, each collecting component having at least one primary collecting zone extended by at least one extension having at least one secondary collecting zone, the secondary collecting zones ending in at least substantially planar axial extension portions forming a first magnetic pole and a second magnetic pole of the air gap, the at least one primary collecting zone and the at least one secondary collecting zone of the two flux-collecting components being positioned respectively on either side of a transverse mid-plane of the at last one air gap intersecting at least one of the extensions across the air gap and each of the collecting components extending past the intersection to create secondary collecting zones for creating the opposing interference magnetic field direction such that the interference magnetic field collected by each of the two flux-collecting components is brought into the air gap in opposing magnetic field directions; and
at least one magnetically sensitive element positioned in the at least one air gap.

* * * * *